United States Patent
Okutoh

[11] Patent Number: 6,060,185
[45] Date of Patent: *May 9, 2000

[54] PROTECTIVE DEVICE FOR SECONDARY BATTERIES

[75] Inventor: Tadashi Okutoh, Kawasaki, Japan

[73] Assignee: Nippon Moli Energy Corp., Japan

[*] Notice: This patent is subject to a terminal disclaimer.

[21] Appl. No.: 08/960,377

[22] Filed: Oct. 29, 1997

[30] Foreign Application Priority Data

Oct. 29, 1996 [JP] Japan ................................ 8-286756

[51] Int. Cl.[7] .......................... H01M 14/00; H01M 10/46
[52] U.S. Cl. .................... 429/7; 429/62; 429/90; 320/134; 320/154
[58] Field of Search ................ 429/61, 62, 90, 429/91, 7; 320/30, 32, 39, 43, 134, 149, 150, 154

[56] References Cited

U.S. PATENT DOCUMENTS

| | | | |
|---|---|---|---|
| 5,569,550 | 10/1996 | Garrett et al. | 429/7 |
| 5,637,413 | 6/1997 | Fernandez et al. | 429/7 |
| 5,645,949 | 7/1997 | Young | 429/7 |

*Primary Examiner*—Anthony Skapars
*Attorney, Agent, or Firm*—Gottlieb, Rackman & Reisman, P.C.

[57] ABSTRACT

The invention provides a protective device for batteries having a high energy density such as lithium ion batteries. The protective device comprises a battery voltage-monitoring means, an overcharge-detecting means for sending out a charge-finishing signal when a voltage detected by the battery voltage-detecting means is higher than a preset value, a charge-finishing means for finishing charge in response to the charge-finishing signal, an output-counting means for counting the number of charge-finishing signals sent out of the charge-finishing means, and a cutoff means for cutting off conduction of a current in said batteries when a counted value reaches a preset value, thereby limiting the number of permissible overcharging cycles.

2 Claims, 1 Drawing Sheet

PROTECTIVE DEVICE FOR SECONDARY BATTERIES

BACKGROUND OF THE INVENTION

The present invention relates to a device for protecting secondary batteries, and more particularly to a device for protecting secondary batteries charged with abnormal voltage.

Lithium ion batteries employing carbonaceous materials capable of doping or dedoping lithium ions are lightweight systems having high operating voltage and a high energy density, and so expected to have applications in the form of power supply secondary batteries for various types of portable equipment including mobile radio communications terminals such as portable phones, portable personal computers, and camcorders.

A secondary battery can be repeatedly used by charging. For charging, however, full-charging should be achieved for a short time of period while care is taken of prevention of overcharging that may otherwise result in a malfunction or breakdown of the battery.

A lithium ion battery is built up of an anode formed of a carbonaceous material capable of doping or dedoping lithium ions, a cathode formed of a lithium ion interlaminar compound such as at least one compound of $Li_xM_yO_z$ wherein M is Ni and/or Co and/or Mn, a separator formed of polyethylene, polypropylene or the like, and an electrolyte comprising a lithium salt dissolved in a non-aqueous organic solvent.

Upon overcharging of the lithium ion battery, the deposition of lithium on the anode occurs, and the internal pressure of the battery increases due to the generation of gas. When the internal pressure exceeds a certain threshold, an overpressure release valve is put into operation, resulting in an electrolyte leakage and, in the worse case, a breakdown of the battery.

According to one approach proposed to achieve safe full-charging of a lithium ion battery for a short time of period, the lithium ion battery is charged using a constant current at an initial charging stage and then using a constant voltage at the time when the charging voltage reaches a predetermined voltage.

Even when charging is carried out under controlled charging current and voltage conditions, however, there is a possibility that the voltage applied on the battery may increase by reason of anything abnormal. This voltage increase may in turn put the battery in an overcharged state.

In only a few applications, one single lithium ion battery is used. In other words, it is general that, in order to obtain predetermined voltage or current, a plurality of batteries are set in a battery room in equipment with which they are used, or a battery package having a plurality of batteries therein is detachably mounted in equipment with which they are used. Even in this case, there is still an undeniable possibility that trouble with one battery in service may have some adverse or grave influences on the remaining batteries.

To provide protection against overcharging, and overcurrents at the time of charging or in service as well as to prevent malfunctions of batteries for the reason of discharging at a voltage below the final discharge voltage of the batteries, various protective devices have been proposed. These protective devices are packed in a battery package or located in the vicinity of batteries.

For charging, a battery is connected to a charger to supply a current thereto. In some cases, the battery is placed in an overcharged state by the application of unacceptably high voltage thereto, which may be caused by a malfunction of the charger or the connection thereof to a charger operating at an improper voltage. This overcharged state may be eliminated as by a voltage-monitoring means in a battery-protecting device, which detects the voltage of the battery higher than a preset voltage to cut off a charging current. If the charger itself has a problem, however, repeated overcharging occurs until a voltage preset for the protective device is reached.

As a lithium ion battery is exposed to repeated overcharging, arborescent crystals of metal lithium grow on the surface of an anode formed of a carbonaceous material doping or dedoping lithium ions to such an extent that they break through a separator formed of polyethylene, polypropylene or the like. This in turn causes rapid reactions, resulting in a pressure increase in the battery. As the internal pressure exceeds a certain threshold, an overpressure release valve is actuated, ending up with electrolyte spills. In the worst case, there is a breakdown of the battery, thermal runaway, etc.

The present invention is concerned with a protective device for secondary batteries having a high energy density such as lithium ion batteries using a carbonaceous material doping or dedoping lithium ions as an active anode material. An object of the present invention is to provide a protective device which, when such batteries are repeatedly charged to an overcharged state, is actuated to disable them without detriment to their safety.

SUMMARY OF THE INVENTION

According to one aspect of the present invention, there is provided a protective device for secondary batteries using a non-aqueous electrolyte, comprising a battery voltage-monitoring means, an overcharge-detecting means for sending out a charge-finishing signal when a voltage detected by the battery voltage-detecting means is higher than a preset value, a charge-finishing means for finishing charge in response to the charge-finishing signal, an output-counting means for counting the number of charge-finishing signals sent out of the charge-finishing means, and a cutoff means for cutting off conduction of a current in said batteries when a counted value reaches a preset value.

According to another aspect of the present invention, there is provided a protective device for secondary batteries using a non-aqueous electrolyte, comprising a battery voltage-monitoring means, an overcharge-detecting means for sending out a charge-finishing signal when a voltage detected by the battery voltage-detecting means is higher than a preset value, a charge-finishing means for finishing charge in response to the charge-finishing signal, an output-counting means for counting the number of charge-finishing signals sent out of the charge-finishing means, and a cutoff means for cutting off conduction of a current in said batteries when a counted value reaches a preset value, and further includes a charging current-conducting circuit comprising a voltage-detecting means for detecting voltages of batteries being charged, a heat-generating resistance which conducts a current when a detected voltage exceeds a preset voltage, and a temperature fuse thermally coupled to said heat-generating resistance, so that when a state where said battery voltage is higher than a preset value continues longer than a preset time, said temperature fuse is fused down to cut off a charging circuit for said batteries and an current output from said batteries, thereby disabling said batteries, and then placing said batteries in a dischargeable state.

DESCRIPTION OF THE PREFERRED EMBODIMENT

The present invention provides a protective device for secondary batteries having a high energy density such as lithium ion batteries using a carbonaceous material doping or dedoping lithium ions as an anode material. The charge of the batteries is finished at the time they are placed in an overcharged state, and how many times they were overcharged is counted. When the number of overcharging cycles exceeds a given number, the batteries are disabled to prevent troubles likely to be caused by use of the repeatedly overcharged batteries.

Preferred embodiments of the present invention will now be explained with reference to FIGS. 1 and 2. Illustrated in FIG. 1 is one embodiment of the protective device according to the present invention.

Figure 1:
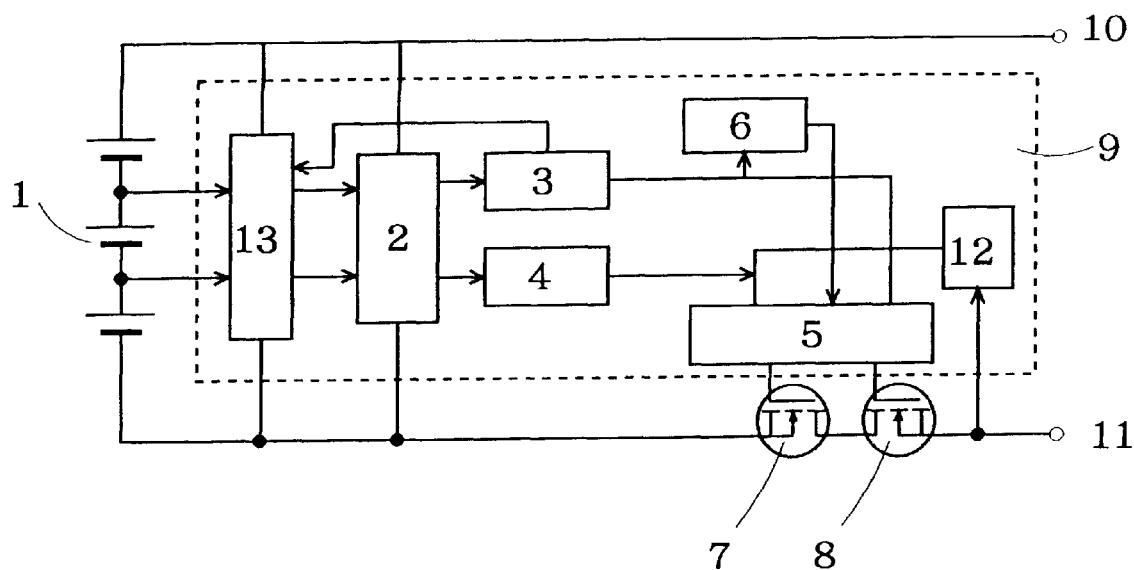
FIG. 1 is a schematic illustrative of one embodiment of the protective device for secondary batteries according to the present invention.
Figure 2:
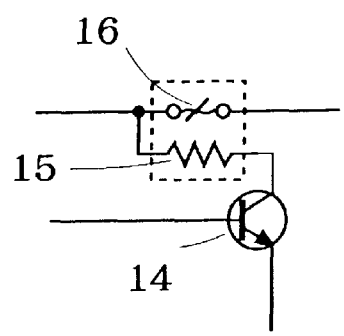
FIG. 2 is a partial schematic illustrative of the temperature fuse.

Referring to FIG. 1, a battery group 1 comprises three lithium ion batteries which are charged by power applied via terminals 10 and 11 on a load, or by charging power. The voltages of the individual batteries are monitored by a voltage-monitoring circuit 2 forming a voltage-monitoring means. As the power is continuously supplied to the load during the discharging process, there is a battery voltage drop. Reference numeral 4 represents an overcharge detector. As the voltage of a battery obtained at the voltage-monitoring circuit 2 increases to a preset overcharging voltage, the output from the overcharge detector 4 is inverted to put off a discharging switch 7 via a switch driver circuit 5, so that the discharge of the battery is finished. Reference numeral 13 stands for an overcurrent-protecting circuit. As an excessive current passes through the load, there is a voltage drop across discharging and charging switches 7 and 8 due to their on-resistance. As the voltage drop reaches a voltage preset by the overcurrent-protecting circuit, the discharging switch 7 is put off via the switch driver circuit 5, so that the discharge of the battery is finished.

Reference numeral 3 is an overcharge-detecting means. As the voltage of a battery obtained at the voltage-monitoring circuit 2 reaches the preset voltage, the output from the overcharge-detecting means is inverted to put off the charging switch 8 via the switch driver circuit 5 forming a charge-finishing means, so that the charge of the battery is finished. Reference numeral 6 indicates a counter means for counting the number of inversion cycles of outputs. As the number of inversion cycles counted reaches a preset number, the switch driver circuit 5, charging switch 8 and discharging switch 7 forming a cutoff means are put off so that the charge and discharge of the battery are finished to inhibit the use of the battery. The counter means 6 can be reset for reuse if the batteries 3 in the battery group 1 are again connected to one another. Reference numeral 12 represents a discharging circuit for allowing a battery to be discharged at the time it is placed in an overcharged state, thereby lowering the voltage of the battery to a safe level.

An area indicated by a dotted line 9 is a function contained as single one chip on an integrated circuit, and can be provided at relatively low costs. According to the present invention, batteries can be used with ever-higher safety and so contribute to making effective use of resources, because the number of overcharging cycles is limited to the number preset by the counter means, as explained above.

It is here noted that an element such as a temperature fuse-cutting element may be used for a MOSFET forming the charging switch 8. In this case, the use of batteries may be permanently inhibited by cutting the temperature fuse in response to the output from the counter. As shown in FIG. 2, for instance, a current passes through a heat-generating resistance 14 while a transistor 13 forming a heat-generating means remains conducted. The heat-generating resistance 15 is thermally coupled to a temperature fuse 16 located in a charging current-conducting circuit. Preferably in the practice of the present invention, the heat-generating resistance has a heat capacity large enough to fuse down the temperature fuse for a given time, especially 10 to 30 seconds. It is also preferable that the temperature fuse is located in the vicinity of a battery, and can be fused down at a temperature lower than the highest temperature of a separator forming a part of the battery, at which the separator can be used. This in turn makes it possible to prevent accidents due to the generation of abnormal heat from the battery, because the temperature fuse is fused down even when the battery temperature increases for reasons other than overcharging.

For a lithium ion battery, a microporous polyethylene or polypropylene separator is generally used. At high temperatures, however, the separator is not only softened to such a degree that it can no longer function as a separator, but also induces the reaction between active cathode and anode materials, often resulting in an internal pressure increase, thermal runaway, and so on. The upper limit of temperatures at which currently available polyethylene separators can be used is about 110° C. In the practice of the present invention, therefore, it is preferable to use a temperature fuse that can be fused down at a temperature of up to 110° C.

When the temperature fuse is fused down by overcharging during the charging process, the active materials are in a dischargeable state even after the supply of the charging current has been shut down. The amount of the active materials in a dischargeable state varies depending on to what degree the battery is charged. However, if a battery that may have anything unusual due to overcharging, especially a lithium ion battery having a large energy density, is in a dischargeable state, a large amount of energy is then built up in the form of active materials. This may in turn lead to an intermediate likelihood of thermal runaway, an internal pressure increase, etc.

Such a problem, too, can be solved by the present invention because, when the temperature fuse is fused down by the actuation of an overcharged state-detecting means or when the temperature fuse is fused down by heat generated in the battery or an ambient temperature rise, the fusing-down of the temperature fuse is detected by means for detecting the fusing-down of the temperature fuse so that the energy built up in the battery can be released by a discharging means made up of a switching transistor, a discharging resistance and the like, thereby placing the battery in a safe state.

Further, the protective circuit of the present invention may be designed in such a manner as to display the value of the number of overcharging cycles counted on a display device of equipment with which batteries are used, or display the state of overcharging on a monitor screen of equipment having display means such as a personal computer.

Furthermore, a dedicated signal line for transmitting signals may be superposed on a circuit for the terminals 10 and 11 through which currents are delivered from batteries.

By counting the number of overcharging cycles according to the present invention, it is possible to use batteries in a very safe state because there is no possibility that the number of overcharging cycles may exceed the preset upper limit.

What we claim is:

1. A protective device for secondary batteries using a non-aqueous electrolyte, comprising a battery voltage-monitoring means, an overcharge-detecting means for sending out a charge-finishing signal when a voltage detected by the battery voltage-detecting means is higher than a preset value, a charge-finishing means for finishing charge in response to the charge-finishing signal, an output-counting means for counting the number of charge-finishing signals sent out of the charge-finishing means, and a cutoff means for cutting off conduction of a current in said batteries when a counted value reaches a preset value.

2. A protective device for secondary batteries using a non-aqueous electrolyte, comprising a battery voltage-monitoring means, an overcharge-detecting means for sending out a charge-finishing signal when a voltage detected by the battery voltage-detecting means is higher than a preset value, a charge-finishing means for finishing charge in response to the charge-finishing signal, an output-counting means for counting the number of charge-finishing signals sent out of the charge-finishing means, and a cutoff means for cutting off conduction of a current in said batteries when a counted value reaches a preset value, and further includes a charging current-conducting circuit comprising a voltage-detecting means for detecting voltages of batteries being charged, a heat-generating resistance which conducts a current when a detected voltage exceeds a preset voltage, and a temperature fuse thermally coupled to said heat-generating resistance, so that when a state where said battery voltage is higher than a preset value continues longer than a preset time, said temperature fuse is fused down to cut off a charging circuit for said batteries and an output current from said batteries, thereby disabling said batteries, and then placing said batteries in a dischargeable state.

* * * * *